(12) United States Patent
Chiu

(10) Patent No.: US 7,202,111 B2
(45) Date of Patent: *Apr. 10, 2007

(54) METHODS AND APPARATUS FOR DISPOSING A THERMAL INTERFACE MATERIAL BETWEEN A HEAT SOURCE AND A HEAT DISSIPATION DEVICE

(75) Inventor: Chia-Pin Chiu, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/882,511

(22) Filed: Jun. 30, 2004

(65) Prior Publication Data

US 2004/0241912 A1 Dec. 2, 2004

Related U.S. Application Data

(63) Continuation of application No. 10/112,834, filed on Mar. 27, 2002, now Pat. No. 6,767,765.

(51) Int. Cl.
*H01L 21/44* (2006.01)
*H01L 21/48* (2006.01)
*H01L 21/50* (2006.01)

(52) U.S. Cl. .................. 438/122; 257/E21.499

(58) Field of Classification Search .......... 438/122, 438/118, 119, 584; 156/48, 51, 60, 87; 425/110, 425/127; 264/261, 263; 29/455.1, 469

See application file for complete search history.

(56) References Cited

U.S. PATENT DOCUMENTS

| | | | |
|---|---|---|---|
| 5,608,262 A | 3/1997 | Degani et al. | |
| 5,796,582 A | 8/1998 | Katchmar | |
| 6,015,722 A | 1/2000 | Banks et al. | |
| 6,016,006 A | 1/2000 | Kolman et al. | |
| 6,117,382 A | 9/2000 | Thummel | |
| 6,552,906 B2 | 4/2003 | Kanada | |
| 6,767,765 B2 * | 7/2004 | Chiu | 438/122 |

* cited by examiner

*Primary Examiner*—David A. Zarneke
(74) *Attorney, Agent, or Firm*—Robert G. Winkle

(57) ABSTRACT

A microelectronic package and a method of forming the same comprising a microelectronic device attached by an active surface to a substrate. A heat dissipation device having a base portion is positioned over a back surface of the microelectronic device and having at least one lip portion extending from the base portion which is attached to the substrate. An inlet extends through the heat dissipation device base portion and is positioned to be over the microelectronic device back surface. A thermal interface material is dispensed through the inlet and by capillary action is drawn between the microelectronic device back surface and the heat dissipation device base portion.

10 Claims, 6 Drawing Sheets

METHODS AND APPARATUS FOR DISPOSING A THERMAL INTERFACE MATERIAL BETWEEN A HEAT SOURCE AND A HEAT DISSIPATION DEVICE

CROSS REFERENCE TO RELATED APPLICATION

This application is a continuation of U.S. patent application Ser. No. 10/112,834 filed Mar. 27, 2002 now U.S. Pat. No. 6,767,765.

BACKGROUND OF THE INVENTION

1. Field of the Invention

The present invention relates to apparatus and methods for disposing a thermal interface material between a heat source and a heat dissipation device. In particular, the present invention relates to a microelectronic package comprising a heat dissipation device having an inlet over a back surface of a microelectronic device and an outlet away from the microelectronic device back surface, wherein the thermal interface material is disposed between the heat dissipation device and the microelectronic device through the inlet.

2. State of the Art

Higher performance, lower cost, increased miniaturization of integrated circuit components, and greater packaging densities of integrated circuits are ongoing goals of the microelectronic industry. As these goals are achieved, microelectronic dice become smaller. Accordingly, the density of power consumption of the integrated circuit components in the microelectronic device has increased, which, in turn, increases the average junction temperature of the microelectronic device. If the temperature of the microelectronic device becomes too high, the integrated circuits of the microelectronic device may be damaged or destroyed.

Various apparatus and techniques have been used and are presently being used for removing heat from microelectronic devices. One such heat dissipation technique involves the attachment of a heat dissipation device to a microelectronic device. FIG. 9 illustrates an assembly 200 comprising a microelectronic device 202 (illustrated as a flip chip) physically and electrically attached by an active surface 204 thereof to a first surface 206 of a carrier substrate 208 by a first plurality of interconnects 212, such as solder balls. An underfill material 214 may be disposed between the microelectronic device active surface 204 and the carrier substrate 208. A second plurality of interconnects 216 may be attached to a second surface 218 of said carrier substrate 208 for connection to external components (not shown).

An interior surface 224 of a heat dissipation device 226 may be attached to a back surface 228 of the microelectronic device 202 by a thermal interface material 232, such as thermally conductive adhesive or solder. The heat dissipation device 226 may further comprise a lip portion 234 extending toward and attached to the carrier substrate 208 with an adhesive material 236, such as epoxies, urethane, polyurethane, silicone elastomers, and the like. The heat dissipation device 226 may be constructed from a thermally conductive material, such as copper, copper alloys, aluminum, aluminum alloys, and the like.

However, the disposition of the thermal interface material 232 between the microelectronic device 202 and the heat dissipation device 226 is a difficult process. FIG. 10 illustrates a known process for disposing the thermal interface material. The thermal interface material is placed as pre-formed sheet 242 between the microelectronic device back surface 228 and the heat dissipation device interior surface 224. The assembly is then pressurized (first force 244 on the heat dissipation device 226 and/or second force 246 on the microelectronic device 202) while being heated, such as in an oven, which melts the thermal interface material pre-formed sheet 242 and adheres it to the heat dissipation device 226 and the microelectronic device 202. Unfortunately, this process can easily trap air pockets or voids 248 between the thermal interface material pre-formed sheet 242 and the heat dissipation device interior surface 224, and/or the thermal interface material pre-formed sheet 242 and the microelectronic device back surface 228. The voids 248 greatly reduce the heat transfer from the microelectronic device 202, as will be understood to those skilled in the art.

FIGS. 11 and 12 show methods of forming a void-free thermal interface. FIG. 11 illustrates one method which comprises placing a liquid thermal interface material 252 on an edge 254 of a gap 256 between the heat dissipation device interior surface 224 and the microelectronic device back surface 228. The liquid thermal interface material 252 is drawn into the gap 256 in direction 258 by capillary action. One way to achieve this is dip the edge 254 into a solder bath. However, as it is understood by those skilled in the art, it is difficult to apply this method to the assembly, as shown in FIG. 9, due to the larger sizes of the heat dissipation device 226 and carrier substrate 208, relative to the microelectronic device 202.

FIG. 12 illustrates another method which comprises placing a small, thick thermal interface material globule 262 between the heat dissipation device interior surface 224 and the microelectronic device back surface 228 at or near a center of the microelectronic device back surface 228. The thermal interface material globule 262 is then heated, such as in an oven, so that it becomes flowable and a first force 264 is placed on the heat dissipation device 226 and/or second force 266 is placed on the microelectronic device 202, such that the thermal interface material 262 is dispersed across the microelectronic device back surface 228. This method can be used in situations were the microelectronic device 202 is small (i.e., small bonding applications). However, for microelectronic devices 202 larger than about 300 mils in length, this method becomes ineffective, as the thermal interface material may not extend to the edges of the microelectronic device 202 without considerable pressure and/or temperature.

Therefore, it would be advantageous to develop an improved method and related apparatus for dispersing a thermal interface material between a microelectronic device and a heat dissipation device.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
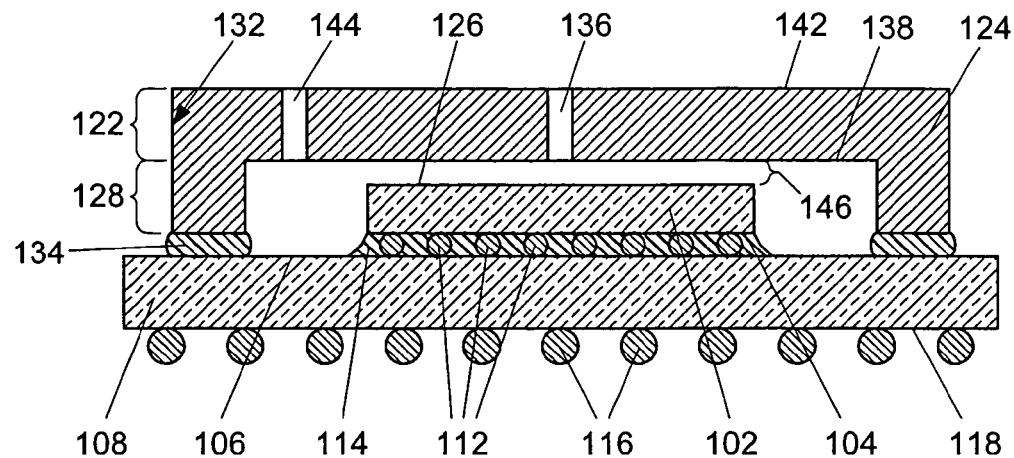
FIG. 1 is a side cross-sectional view of an embodiment of a microelectronic device attached to a substrate and a heat dissipation device extending over the microelectronic device, which is also attached to the substrate, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIGS. 1–7 illustrate a method of fabricating a microelectronic device assembly according to the present invention.

FIG. 1 illustrates a microelectronic device 102 (such as a microprocessor, a chipset, a memory device, an ASIC, and the like), illustrated as a flip-chip, attached by an active surface 104 thereof to a first surface 106 of a carrier substrate 108 (such as an interposer, a motherboard, a back surface of another microelectronic dice, or the like) by a first plurality of interconnects 112, such as solder balls. An underfill material 114, as known in the art, may be disposed between the microelectronic device active surface 104 and the carrier substrate 108. A second plurality of interconnects 116 may be attached to a second surface 118 of said carrier substrate 108 for connection to external components (not shown). Although the present invention is discussed in terms of a "microelectronic device", it is understood that the present invention can be used with any heat generating device.

A base portion 122 of a heat dissipation device 124 is disposed over a back surface 126 (generally opposing said microelectronic device active surface 104) of the microelectronic device 102. The heat dissipation device 124 may include at least one lip portion 128 extending proximate at least one edge 132 of the heat dissipation device base portion 122 toward and attached to the carrier substrate 108 with an adhesive material 134, such as epoxies, urethane, polyurethane, silicone elastomers, and the like. The heat dissipation device lip portion 128 may be contiguous or non-contiguous, and my comprise walls, pillars, and the like, as will be understood by those skilled in the art. The heat dissipation device 124 may be constructed from a thermally conductive material, such as copper (preferred), copper alloys, aluminum, aluminum alloys, and the like.

Figure 2:
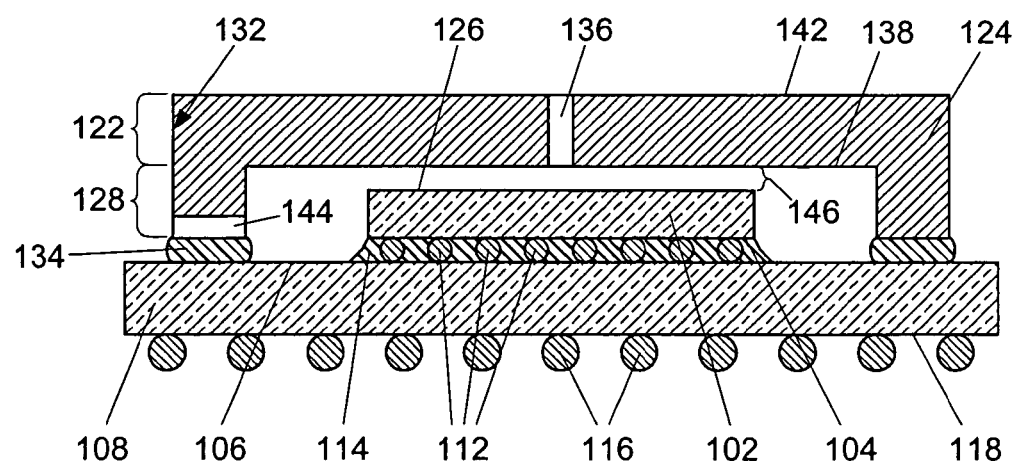
FIG. 2 is a side cross-sectional view of another embodiment of a microelectronic device attached to a substrate and a heat dissipation device extending over the microelectronic device, which is also attached to the substrate, according to the present invention.

The heat dissipation device 124 has an inlet 136 extending through the heat dissipation device base portion 122 from an interior surface 138 to an exterior surface 142 of the heat dissipation device 124. The inlet 136 is position over the microelectronic device back surface 126, preferably over a central portion of the same. The heat dissipation device 124 further includes at least one outlet 144 positioned away from the microelectronic device 102 (e.g., not over the microelectronic device back surface 126). FIG. 1 illustrates the outlet 144 extending through the heat dissipation device base portion 122 from the heat dissipation device interior surface 138 to the heat dissipation device exterior surface 142. However, the outlet 144 may be in any position away from the microelectronic device 102. For example, as shown in FIG. 2, the outlet 144 is a gap in the heat dissipation device lip portion 128.

Figure 3:
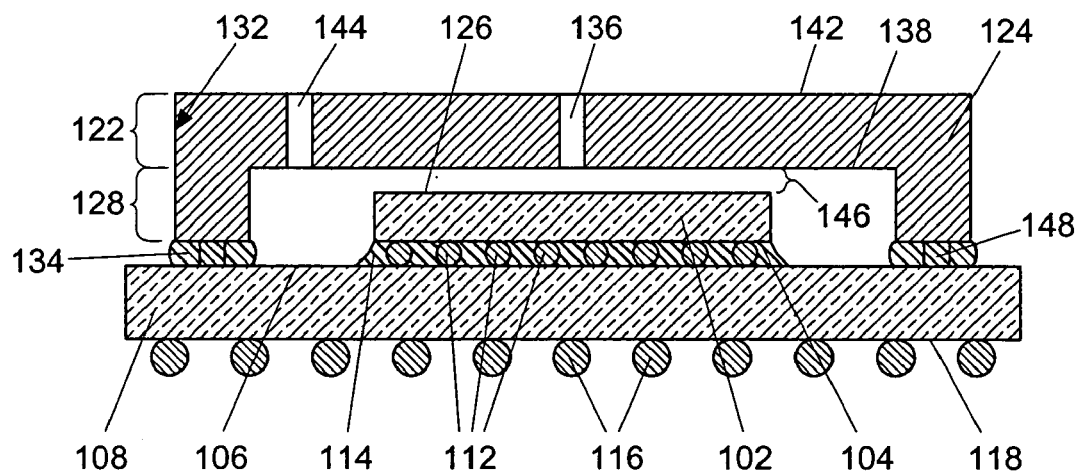
FIG. 3 is a side cross-sectional view of yet another embodiment of a microelectronic device attached to a substrate and a heat dissipation device extending over the microelectronic device, which is also attached to the substrate, according to the present invention.

It is important, as will be discussed later, to maintain an appropriate distance or gap 146 between the heat dissipation device interior surface 138 and the microelectronic device back surface 126. The gap 146 may be between about 1–8 mils, which may be maintained by controlling the amount or the viscosity of the adhesive material 134. The gap 146 may also be maintained through the use of at least one spacer 148 disposed between the heat dissipation device lip portion 128 and the carrier substrate 108, as shown in FIG. 3.

Figure 4:
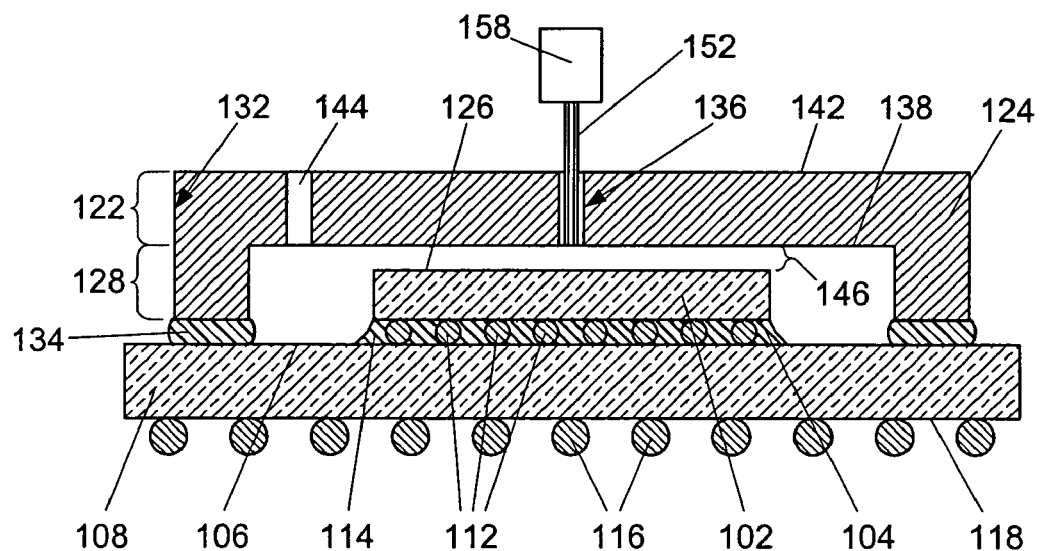
FIG. 4 is a side cross-sectional view of the assembly of FIG. 1 wherein a dispensing device is inserted into an inlet through the heat dissipation device, according to the present invention.
Figure 5:
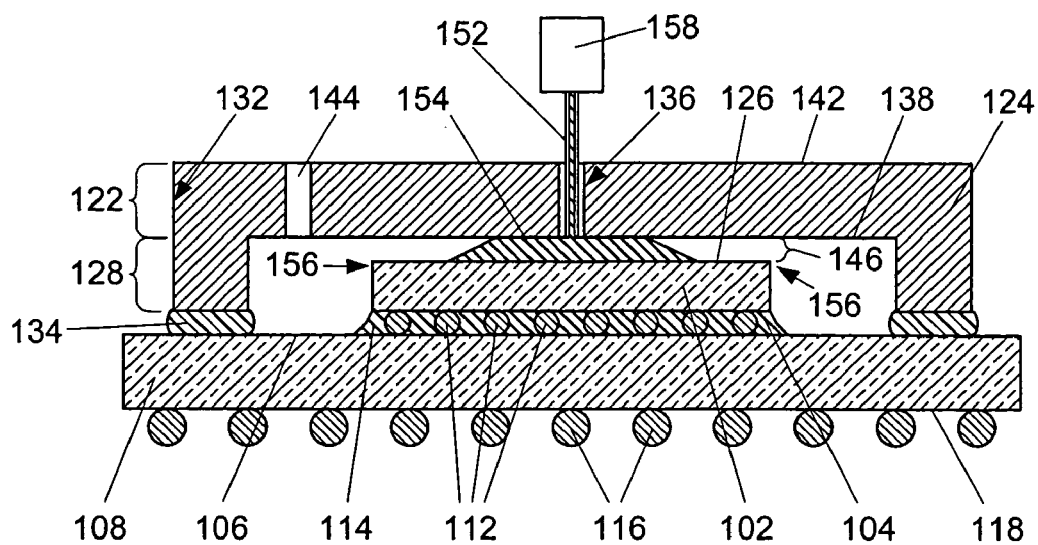
FIG. 5 is a side cross-sectional view of the assembly of FIG. 4 wherein a thermal interface material is dispensed into a gap between the microelectronic device and the heat dissipation device, according to the present invention.

As shown in FIG. 4, a dispensing device 152, such as a needle, is inserted in the inlet 136. A thermal interface material 154 is dispensed through the dispensing device 152 and into the gap 146 where capillary action draws the thermal interface material 154 toward edges 156 of the microelectronic device 102, as shown in FIG. 5. Preferably, the feed rate of the thermal interface material 154 is slow enough to spread laterally by capillary action only, which creates a wetted and void-free interface. The thermal interface material 154 is fed until into the gap 146 until it covers the entire microelectronic device back surface 126.

The thermal interface material 154 may include but is not limited to, thermal grease, phase-change material, metal filled polymer matrix, and solder (alloys of lead, tin, indium, silver, copper, bismuth, and the like [most preferred is indium or lead/tin alloy]). The gap 146 can be adapted to optimize the capillary action based on the type of thermal interface material, to minimize the thermal resistance, and/or to adjust the package stress relief, as will be understood to those skilled in the art. Additionally, it is understood that when a solder is used as the thermal inteface material 154, a backside metallization layer (for example, a 3–5 µm layer of gold, silver, or copper) may be applied to the microelectronic device back surface 126 to enhance the wetout of the solder. Moreover, it is further understood that when a solder is used as the thermal inteface material 154, a coating (for example, a layer of gold or nickel) may be applied to the heat dissipation device interior surface 138 to enhance the wetout of the solder, particularly for heat dissipation devices 124 not made of copper.

In the situation where the thermal interface material 154 must be melted prior to injection into the gap 146, the assembly may be heated in an oven environment. Furthermore, a heating element 158 may be provided on the dispensing device 152 to maintain the thermal interface material 154 in its melting phase, so that the dispensing device 152 will not be clogged by the thermal interface material 154. The air within the gap 146, displaced by the thermal interface material 154, and outgases formed during the assembly process are vented out of the outlet 144.

Figure 6:
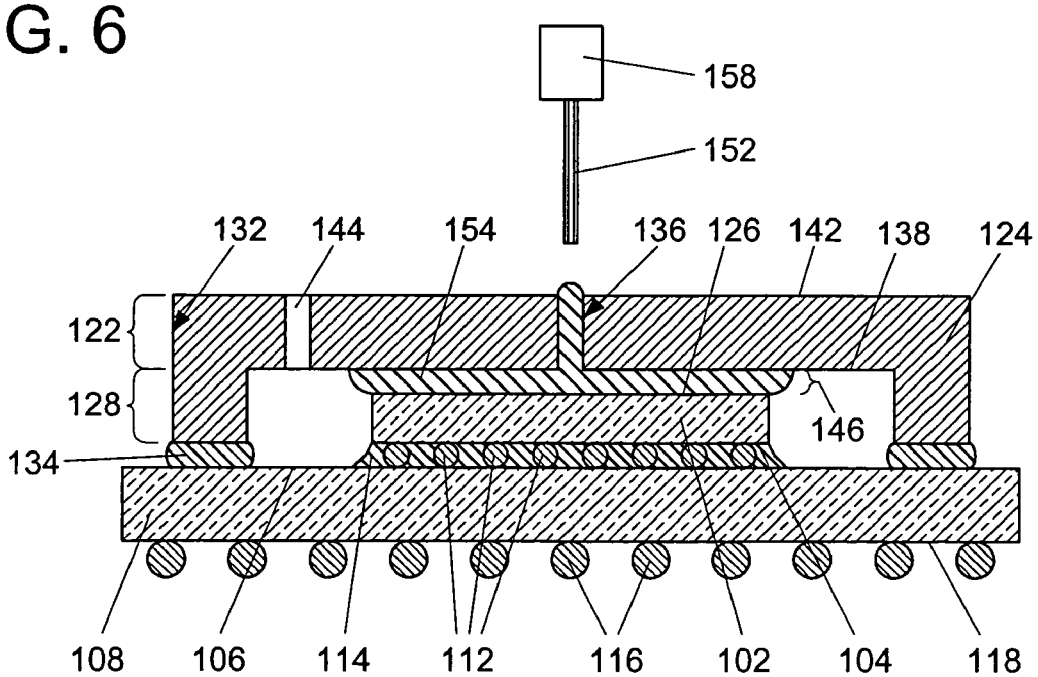
FIG. 6 is a side cross-sectional view of the assembly of FIG. 5 after the dispensing of the thermal interface material, according to the present invention.
Figure 7:
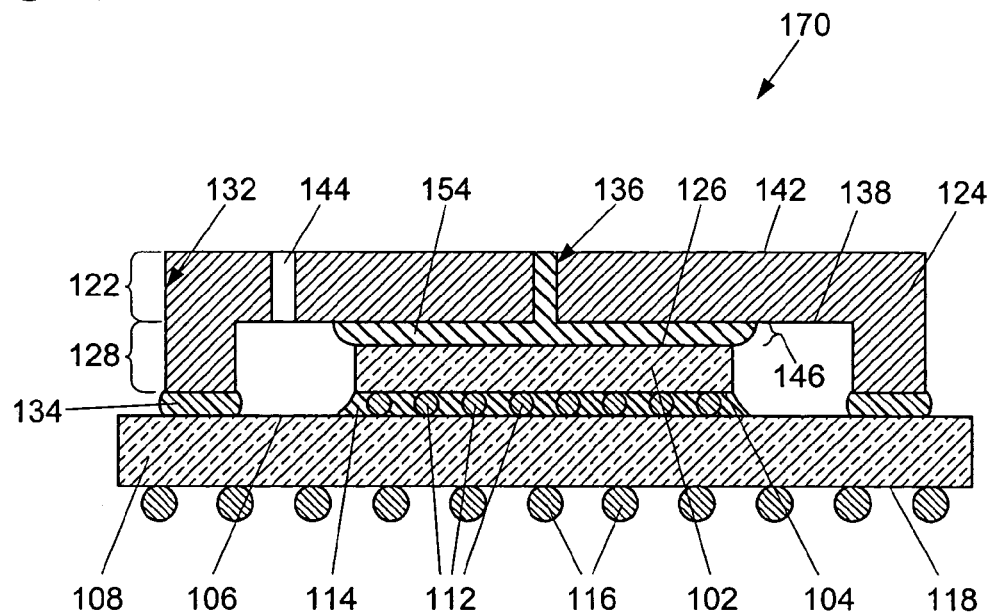
FIG. 7 is a side cross-sectional view of the assembly of FIG. 6 after the removal excess thermal interface material, according to the present invention.

As shown in FIG. 6, after dispensing the thermal interface material 154, the dispensing device 152 is withdrawn from the inlet 136, as the inlet 136 is filled. With thermal interface materials 154 that need to be melted prior to injection, the assembly is cooled down to solidify the thermal interface material 154. Any residual thermal interface material 154 extending above the heat dissipation device exterior surface 142 may be removed to be planar therewith, as shown in FIG. 7, to form a microelectronic package 170. The removal of the excess thermal interface material 154 allows the attachment of an additional thermal dissipation device (not shown), such as a high surface area, finned device, for more efficient heat removal.

Figure 8:
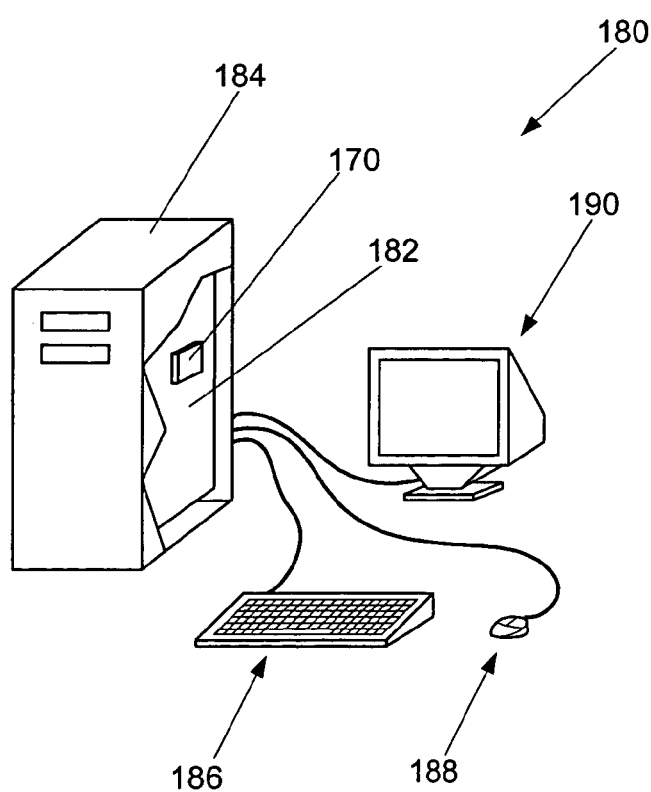
FIG. 8 is schematic of a system utilizing a microelectronic device assembly of the present invention.
Figure 9:
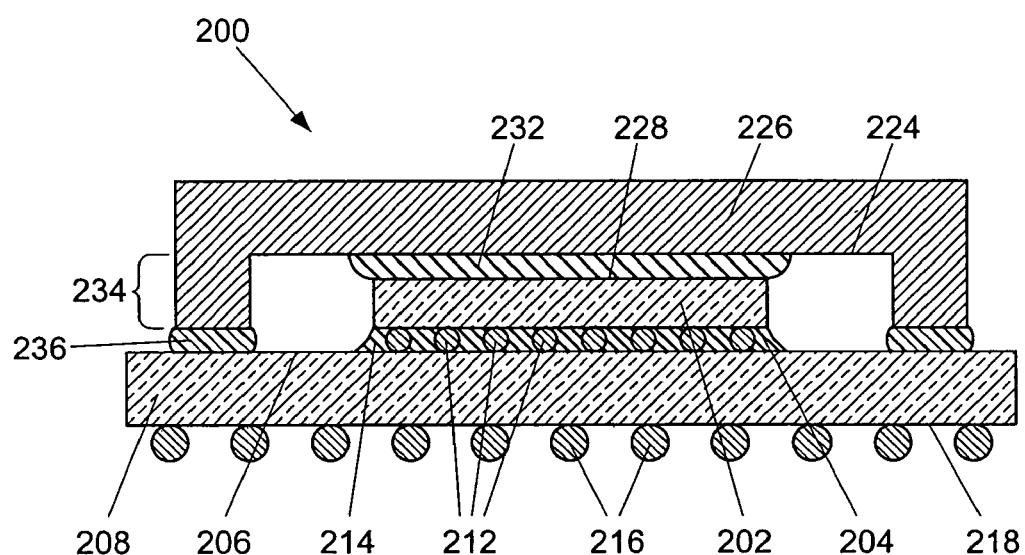
FIG. 9 is a side cross-sectional view of microelectronic device assembly, as known in the art.
Figure 10:
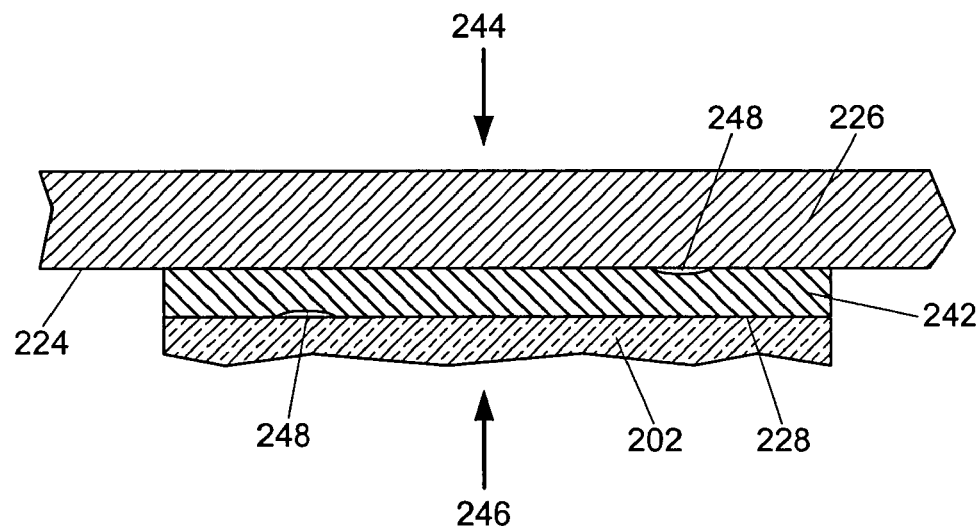
FIG. 10 is a side cross-sectional view of a thermal interface material pre-formed sheet attached between a heat dissipation device and a microelectronic device by heat and pressure, as known in the art.
Figure 11:
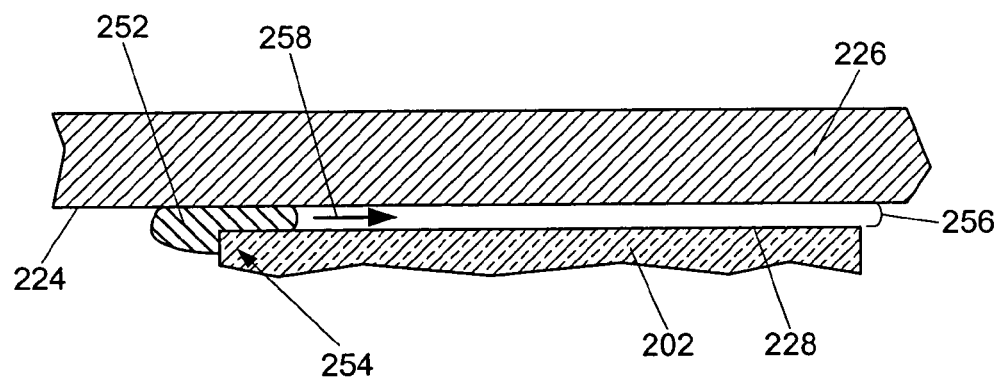
FIG. 11 is a side cross-sectional view of a liquid thermal interface material introduced to an edge of a microelectronic device which flows by capillary action between a heat dissipation device and a microelectronic device, as known in the art.
Figure 12:
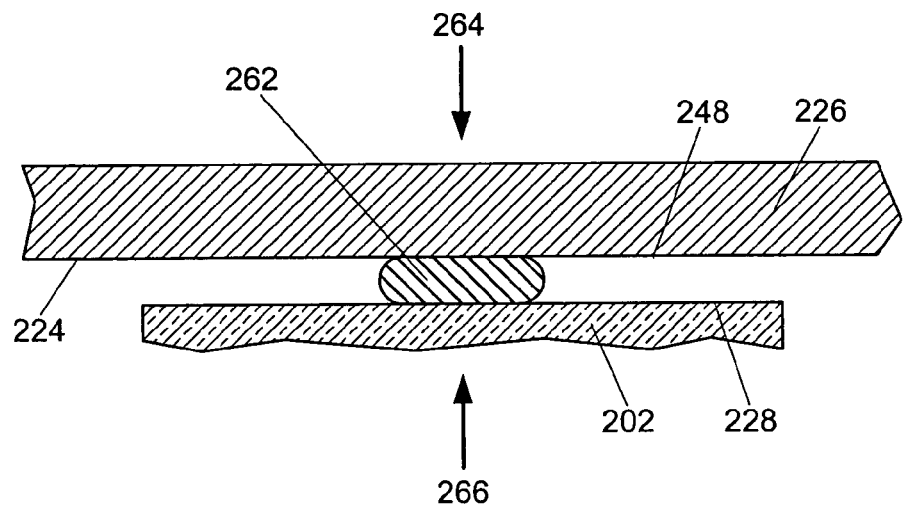
FIG. 12 is a side cross-sectional view of a thermal interface material globule placed between a heat dissipation device and a microelectronic device and spread by heat and pressure, as known in the art.

The microelectronic packages formed by the present invention, such as microelectronic package 170 of FIG. 7, may be used in a computer system 180, as shown in FIG. 8. The computer system 180 may comprise a motherboard 182, with the microelectronic package 170 attached thereto, within a chassis 184. The motherboard 182 may be attached to various peripheral devices including a keyboard 186, a mouse 188, and a monitor 190.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for fabricating a microelectronic assembly, comprising:
   providing a substrate having a microelectronic device attached by an active surface thereto;
   disposing a base portion of a heat dissipation device over a back surface of said microelectronic device, wherein said heat dissipation device includes at least one lip portion extending from said base portion and attached to said substrate;
   providing an inlet through said heat dissipation device base portion disposed over said microelectronic device back surface;
   providing an outlet away from said microelectronic device; and
   dispensing a thermal interface material through said inlet to substantially completely cover only said microelectronic device back surface.

2. The method of claim 1, wherein dispensing said thermal interface material through said inlet further includes dispensing said thermal interface material into a gap between said heat dissipation device base portion and said microelectronic device back surface.

3. The method of claim 2, wherein dispensing said thermal interface material into said gap includes drawing said thermal interface material into said gap through capillary action.

4. The method of claim 1, wherein providing said outlet comprises providing said outlet through said heat dissipation device base portion.

5. The method of claim 1, wherein dispensing a thermal interface material through said inlet comprises dispensing a thermal interface material selected from the group comprising thermal grease, phase-change material, metal filled polymer matrix, and solder.

6. The method of claim 1, further including filling said inlet with said thermal interface material.

7. The method of claim 6, further including removing excess thermal interface material extending above said heat dissipation device base portion.

8. The method of claim 1, wherein dispensing a thermal interface material through said inlet further comprises inserting a dispensing device into said inlet.

9. The method of claim 8, further including providing a heating element coupled to said dispensing device.

10. The method of claim 1, wherein providing said inlet through said heat dissipation device base portion comprises providing said inlet through said heat dissipation device base portion at a central portion of said microelectronic device back surface.

* * * * *